United States Patent
Labonte et al.

(10) Patent No.: US 9,490,317 B1
(45) Date of Patent: Nov. 8, 2016

(54) GATE CONTACT STRUCTURE HAVING GATE CONTACT LAYER

(71) Applicant: GLOBALFOUNDRIES Inc., Grand Cayman (KY)

(72) Inventors: Andre Labonte, Hopewell Junction, NY (US); Ryan Ryoung-han Kim, Albany, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/712,388

(22) Filed: May 14, 2015

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/06* | (2006.01) |
| *H01L 29/78* | (2006.01) |
| *H01L 29/66* | (2006.01) |

(52) U.S. Cl.
CPC ....... *H01L 29/0653* (2013.01); *H01L 29/6656* (2013.01); *H01L 29/78* (2013.01)

(58) Field of Classification Search
CPC H01L 29/78; H01L 29/6656; H01L 29/0653
USPC .................. 257/401, 407; 438/294
See application file for complete search history.

(56) References Cited

U.S. PATENT DOCUMENTS

| | | |
|---|---|---|
| 3,688,656 A | 9/1972 | Applequist et al. |
| 5,343,058 A | 8/1994 | Shiffer, II |
| 5,366,908 A | 11/1994 | Pelella |
| 5,578,515 A | 11/1996 | Chang |
| 6,111,293 A | 8/2000 | Liao |
| 6,406,954 B1 | 6/2002 | Batra et al. |
| 6,624,660 B2 | 9/2003 | Li et al. |
| 6,642,588 B1 | 11/2003 | Porter et al. |
| 6,767,784 B2 | 7/2004 | Porter et al. |
| 6,892,364 B2 | 5/2005 | Baader et al. |
| 7,334,207 B2 | 2/2008 | Preuthen et al. |
| 7,545,161 B2 | 6/2009 | Hsu et al. |
| 8,063,603 B2 | 11/2011 | Reddy |
| 8,413,094 B2 | 4/2013 | Abadeer |
| 8,482,241 B2 | 7/2013 | Reddy et al. |
| 8,502,313 B2 | 8/2013 | Dikshit et al. |
| 2003/0030445 A1 | 2/2003 | Baader et al. |
| 2003/0107406 A1 | 6/2003 | Li et al. |
| 2005/0131645 A1 | 6/2005 | Panopoulos |
| 2006/0268486 A1 | 11/2006 | Preuthen et al. |
| 2007/0058309 A1 | 3/2007 | Tayrani et al. |
| 2007/0096226 A1* | 5/2007 | Liu ........................ H01L 29/513 257/411 |
| 2009/0033355 A1 | 2/2009 | Hsu et al. |
| 2009/0184677 A1 | 7/2009 | Reddy |
| 2011/0248662 A1 | 10/2011 | Reddy |
| 2012/0084741 A1 | 4/2012 | Abadeer |
| 2012/0267714 A1 | 10/2012 | Dikshit et al. |
| 2013/0309852 A1* | 11/2013 | Kanakasabapathy H01L 21/28008 438/585 |

\* cited by examiner

*Primary Examiner* — Thien F Tran
(74) *Attorney, Agent, or Firm* — Heslin Rothenberg Farley and Mesiti PC; Nicholas Mesiti

(57) ABSTRACT

There is set forth herein a gate contact structure for a gate. The gate contact structure can include a first contact layer and a second contact layer. In one embodiment, a gate contact layer can define a contact that provides a gate tie down. In one embodiment, a gate contact layer can have a minimum width larger than a gate length.

16 Claims, 9 Drawing Sheets

GATE CONTACT STRUCTURE HAVING GATE CONTACT LAYER

TECHNICAL FIELD

The present invention relates to a semiconductor structures and more particularly a semiconductor structure having a contact structure.

BACKGROUND OF THE INVENTION

A gate of a semiconductor structure can include gate sidewalls, gate work function conductive material, and a gate capping layer. According to a known approach for fabrication of a gate contact structure, a dielectric layer can be formed over the gate. A contact hole can be formed that extends through the dielectric layer and through the gate capping layer. A gate contact layer can be formed in the gate contact hole. The gate contact layer can span a vertical spacing distance from a top elevation of the conductive gate work function material to a top elevation of the dielectric layer.

A gate tie down structure can be formed that electrically connects a gate to a source-drain. If the gate contact tie down structure is formed improperly a short can easily be defined between a pair of adjacent gates.

BRIEF DESCRIPTION

There is set forth herein a gate contact structure for a gate. The gate contact structure can include a first contact layer and a second contact layer. In one embodiment, a gate contact layer can define a contact that provides a gate tie down. In one embodiment, a gate contact layer can have a minimum width larger than a gate length.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
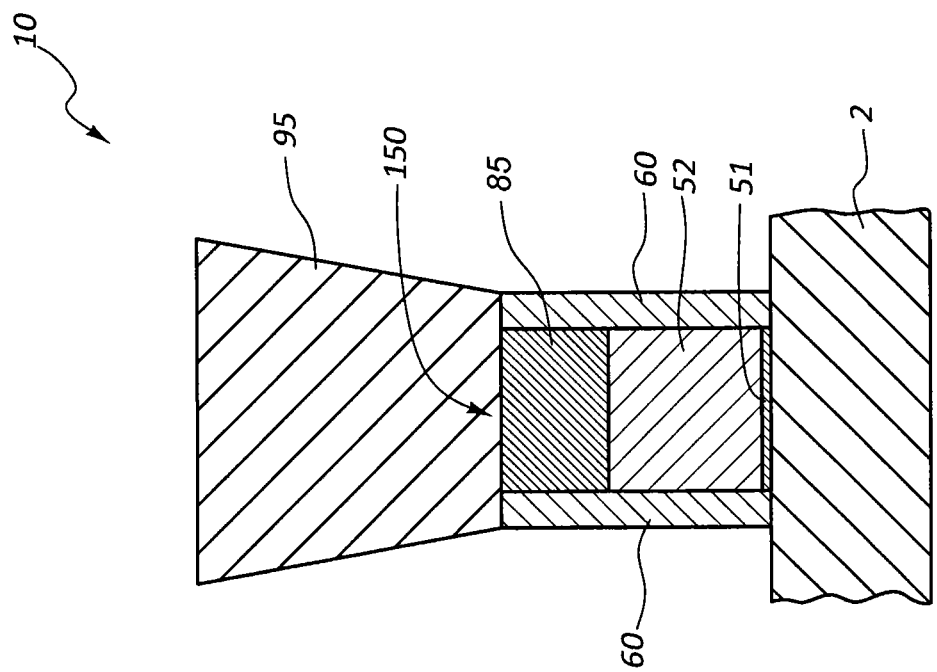
FIG. 1 is a side view of a gate contact structure.

In reference to FIG. 1, there is shown a semiconductor structure 10 with a gate 150 having a gate contact structure that includes a first gate contact layer 85 and a second gate contact layer 95. Gate 150 can also include a gate dielectric layer 51 and conductive work function material layer 52 and dielectric capping layer [70]. The second contact layer 95 can be formed on the first contact layer 85. In one embodiment the first contact layer 85 can have a top elevation in common with a top elevation of a gate spacer 60. In another embodiment, a first contact layer 85 can include a top elevation not in common with a top elevation of gate spacer 60. A method for fabrication of a gate contact structure in one embodiment is set forth in reference to FIGS. 2-10.

Figure 2:
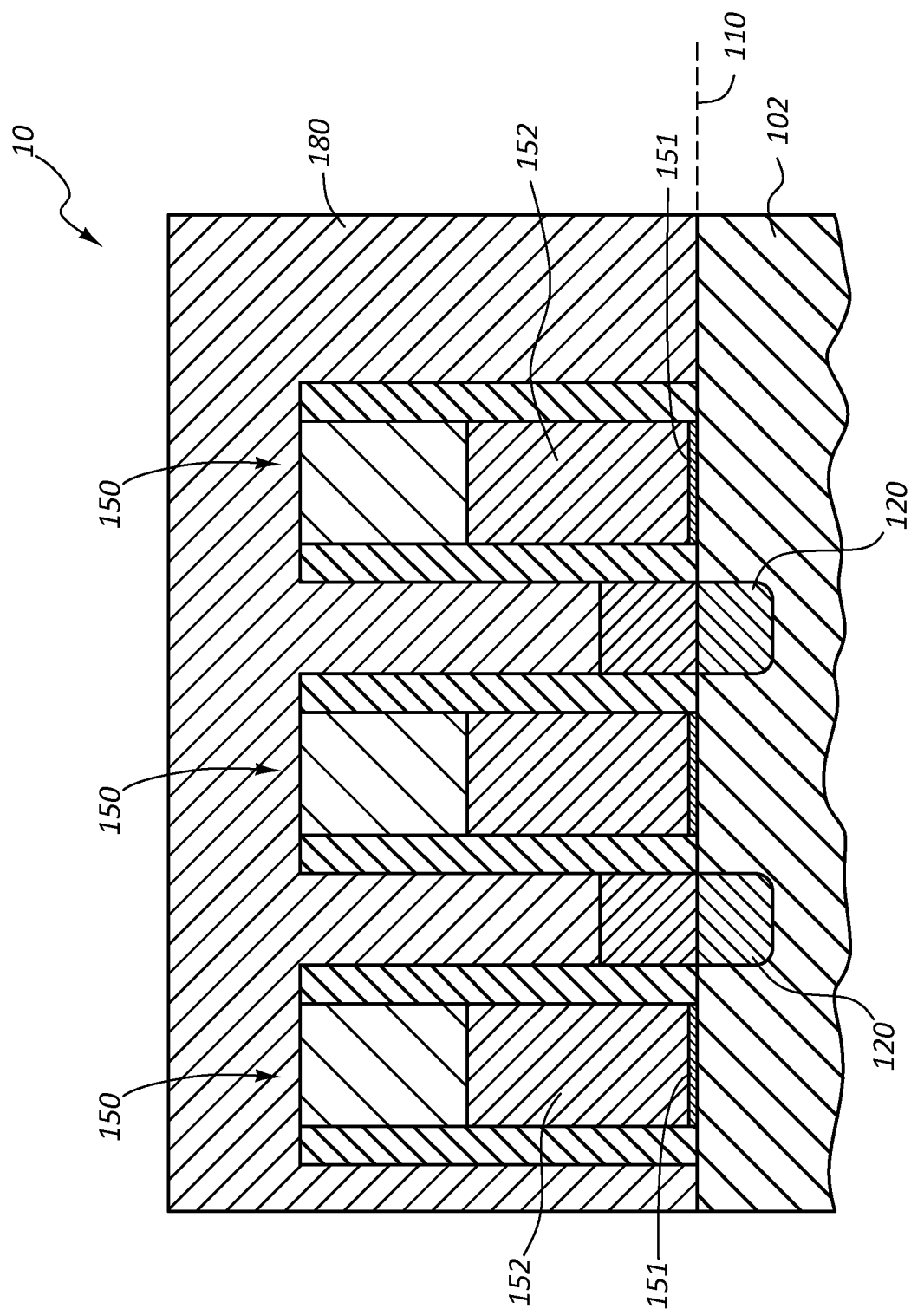
FIG. 2 is a side view of a semiconductor structure in an intermediary fabrication stage after formation of a dielectric layer.

Semiconductor structure 10 in a partial stage of fabrication as shown in FIG. 2 can include a substrate 102, gates 150, and source-drains 120. Source-drains 120 can include a first section (e.g. including an epitaxial growth formation) above a top elevation 110 of substrate 102 and a second section below a top elevation 110 of substrate 102. Gates 150 of semiconductor structure 10 can include gate dielectric layer 151, one or more conductive work function material layer 152, spacers 160, and a capping layer 170. Gate spacers 160 and capping layer 170 can be formed of dielectric material. Semiconductor structure 10 can also include layer 180 formed over gates 150. Layer 180 in one embodiment can be formed of dielectric material, e.g., oxide. Substrate 102 in one embodiment can include fins defined by recessing a bulk substrate main body.

Figure 3:
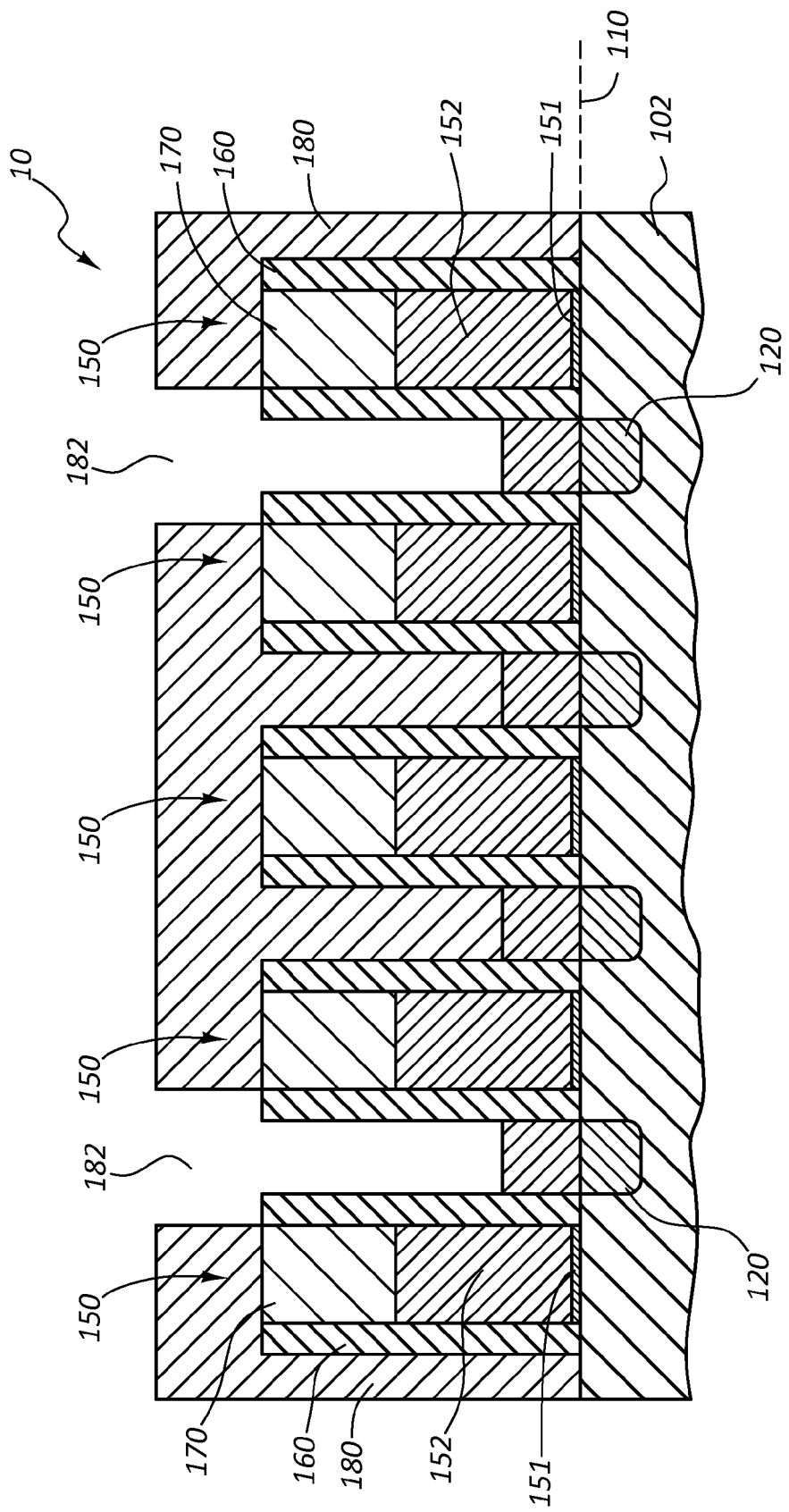
FIG. 3 is a side view of a semiconductor structure in an intermediary fabrication stage after formation of source-drain contact holes.

FIG. 3 illustrates the semiconductor structure 10 as shown in FIG. 2 after patterning of source-drain contact holes 182 in layer 180. The removal of material of layer 180 as shown in FIG. 3 can be performed using an etch process that is selective to material of layer 180. Using an etch process that is selective to material of layer 180 preferentially to material of gate spacers 160, source-drain contact holes 182 can readily be formed that are self-aligned and delimited by surfaces of gate spacers 160.

Figure 4:
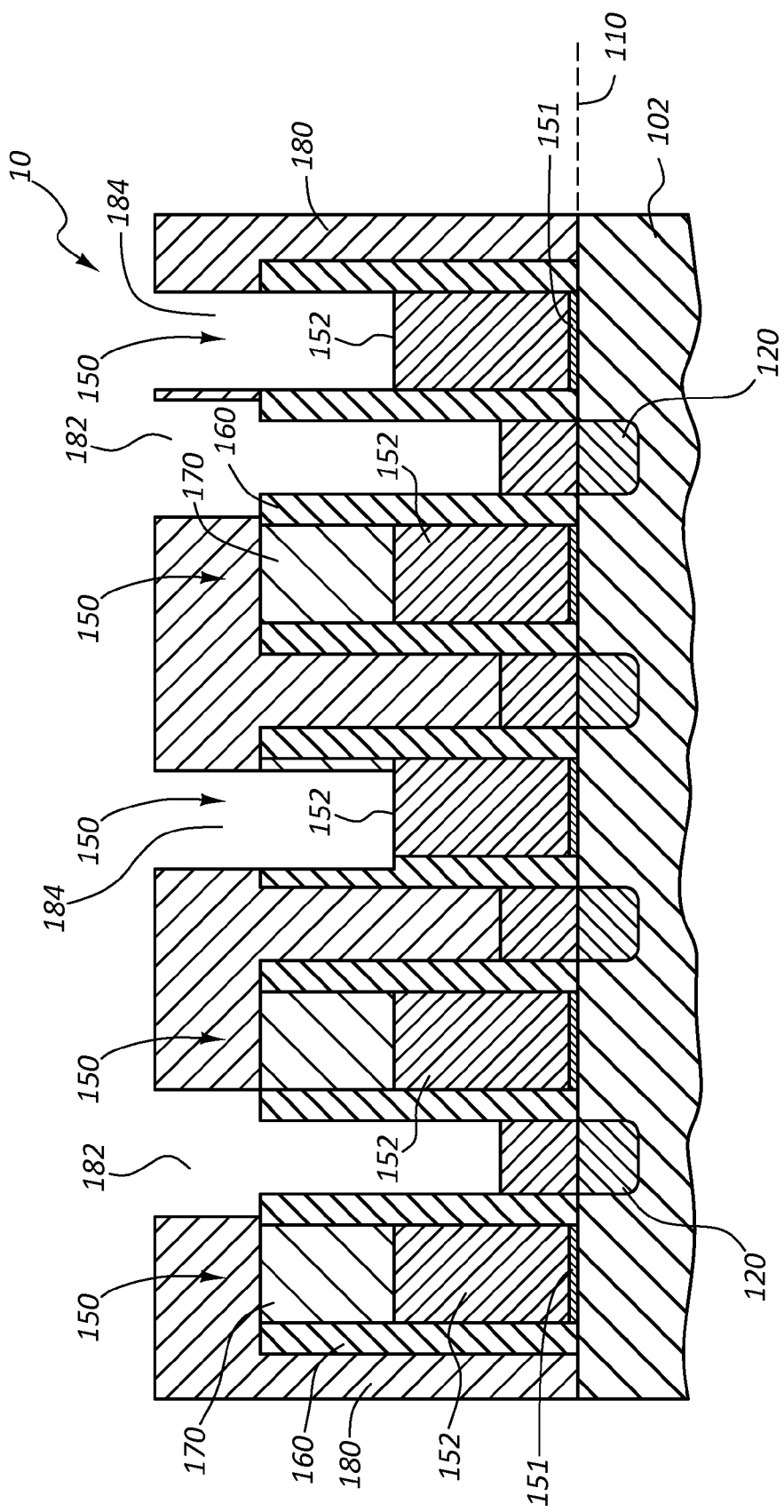
FIG. 4 is a side view of a semiconductor structure in an intermediary fabrication stage after formation of a gate contact hole.

FIG. 4 illustrates the semiconductor structure 10 as shown in FIG. 3 after patterning of layer 180 for formation of gate contact holes 184. Removal of material of layer 180 for the formation of gate contact holes 184 can be performed using a mask (not shown) and an etch process that is selective to dielectric material preferentially to conductive gate material. In one aspect because of similarities between material of spacers 160 and material of capping layer 170, an etch process may be non-selective between material of spacers 160 and material of gate capping layer 170. In one embodiment gate contact holes 184 may be non-self-aligning. In one embodiment, an alignment of holes of gate contact holes 184 can be dependent on an alignment of a mask (not shown) for the formation of gate contact holes 184.

Figure 5:
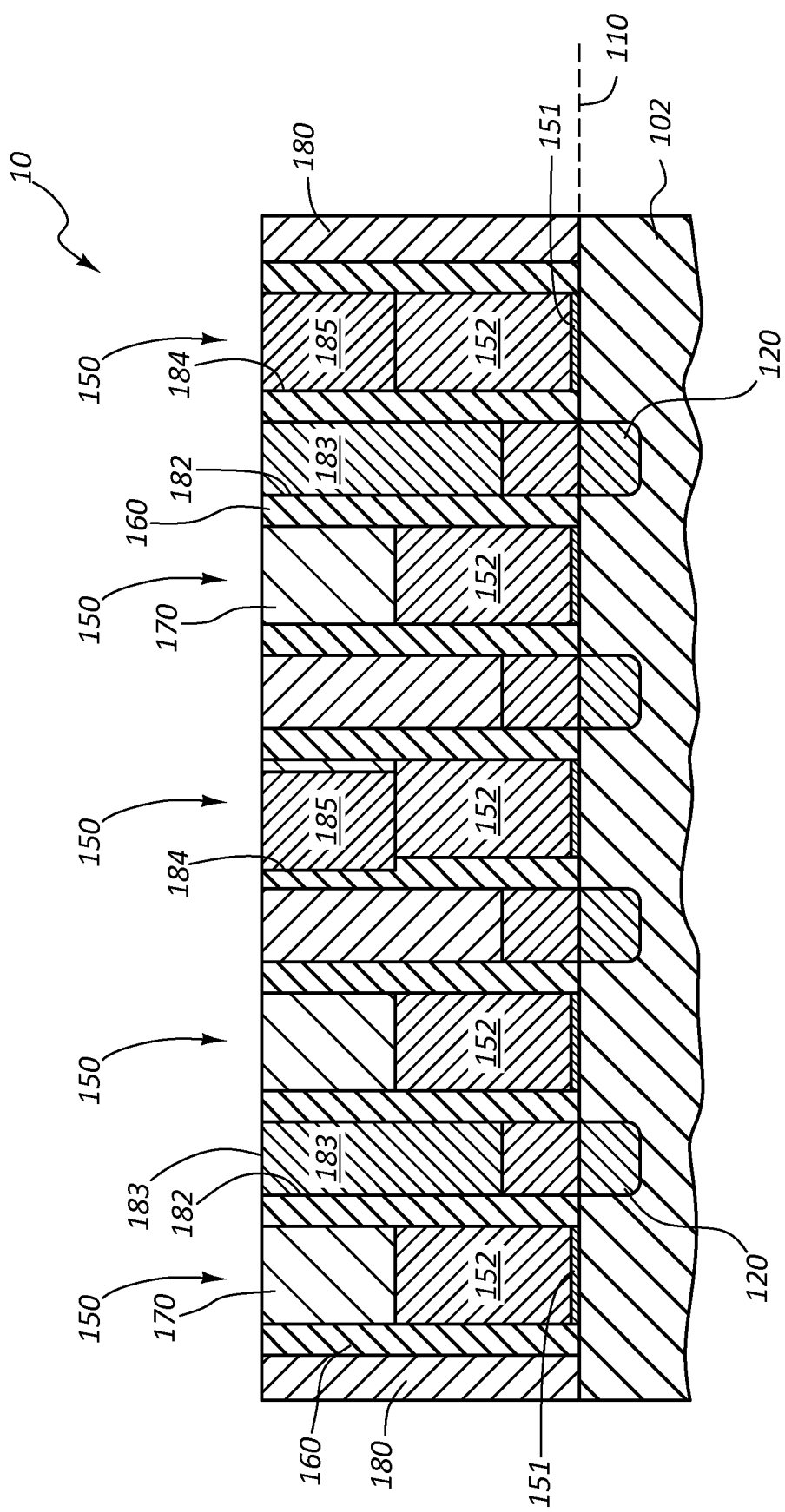
FIG. 5 is a side view of a semiconductor structure in an intermediary fabrication stage after formation of a contact layer and after planarization.

FIG. 5 illustrates the semiconductor structure 10 as shown in FIG. 4 after formation of a source-drain contact layer 183 in source-drain contact holes 182 and after formation of gate contact layer 185 within gate contact holes 184 and after planarization so that a top elevation of source-drain contact layer 183 and a top elevation of gate contact layer 185 and a top elevation of gate spacers 160 are in common and in a common plane. Gate contact layer 185 can be in electrical contact with a conductive section of gate 150, e.g., a top layer of one or more conductive work function layer 152.

Figure 6:
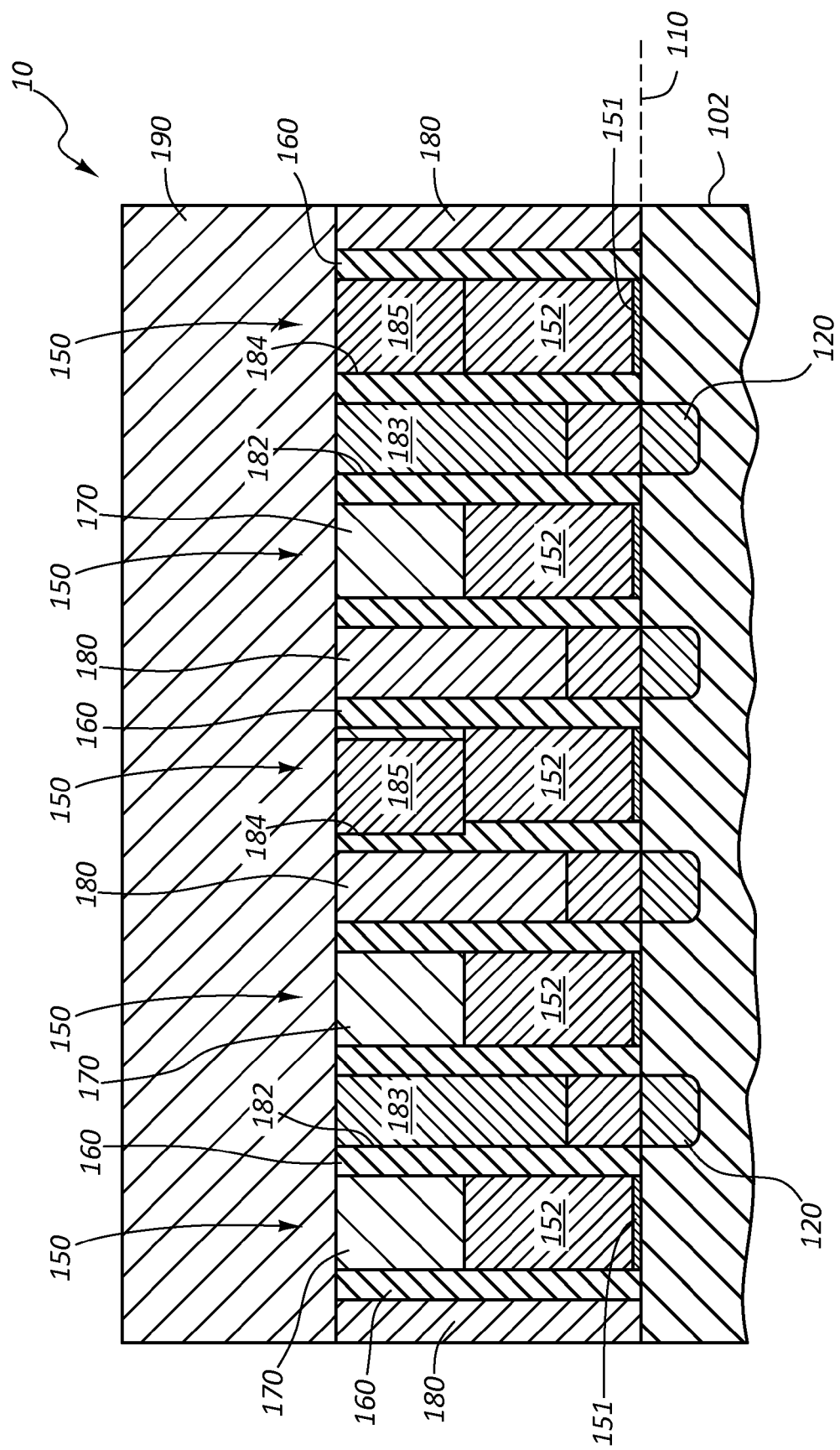
FIG. 6 is a semiconductor structure in an intermediary fabrication stage after formation of a dielectric layer.
Figure 7:
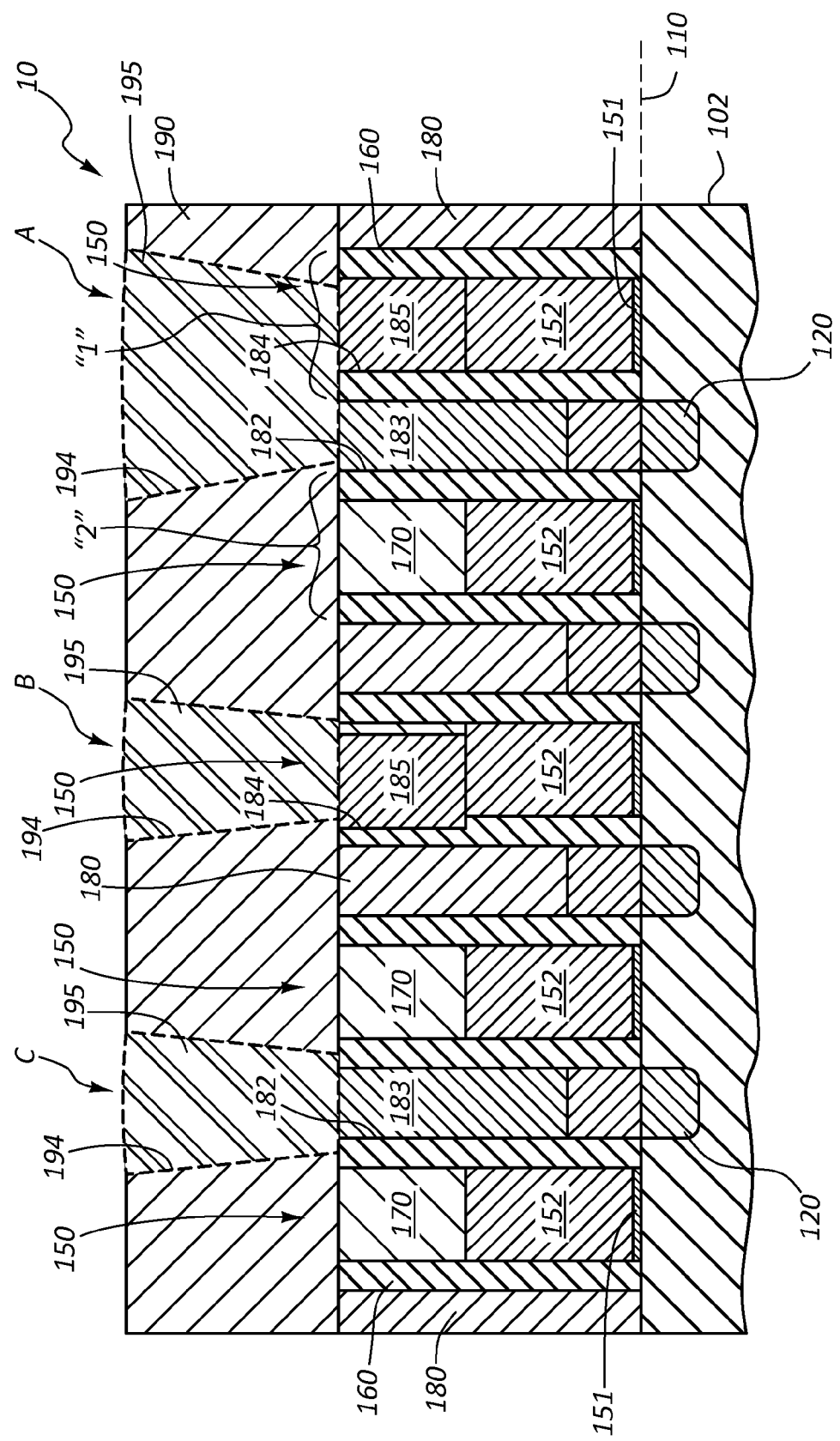
FIG. 7 is a semiconductor structure in an intermediary fabrication stage after formation of a gate contact layer which can be regarded as an upper or second gate contact layer.

FIG. 6 illustrates the semiconductor structure 10 as shown in FIG. 5 after formation of layer 190. Layer 190 can be formed of a dielectric material e.g. oxide in one embodiment. FIG. 7 illustrates the semiconductor structure 10 as shown in FIG. 6 after removal of material of layer 190 to form gate contact holes 194 and after formation of gate contact layer 195 within gate contact holes 194. Source-drain contact layer 183, gate contact layer 185, and gate contact layer 195 can be formed of metal, e.g., tungsten, silver, copper, and/or gold.

Contact layer 195 at location A can be a gate contact layer providing a gate contact structure and defining a gate tie down structure.

Contact layer 195 at location B can be a gate contact layer defining a gate contact structure.

Contact layer 195 at location C can be a source-drain contact layer defining a source/drain contact. Referring to FIG. 7, a gate contact structure can include a first contact layer 185 and a second contact layer 195. First contact layer 185 can have a top elevation in common with a top elevation and gate spacer 160. The multilayer contact structure as shown in FIG. 7 can be useful to avoid shorting between nearest gates 150.

It is seen that even if the gate tie down provided at location A is misaligned so that it contacts the gate 150 at location "2", the gate 150 at location "2" is capped with a capping layer 170 formed of dielectric material, and hence, shorting will not occur. By contrast, if a gate contact structure at location "A" were provided by a single layer gate contact structure extending from a top elevation of one or more conductive work function layer 152 of gates 150 at location "1" and "2" to a top elevation of layer 190, a misalignment of a contact hole could create a short between adjacent gates at location "1" and "2".

Figure 8:
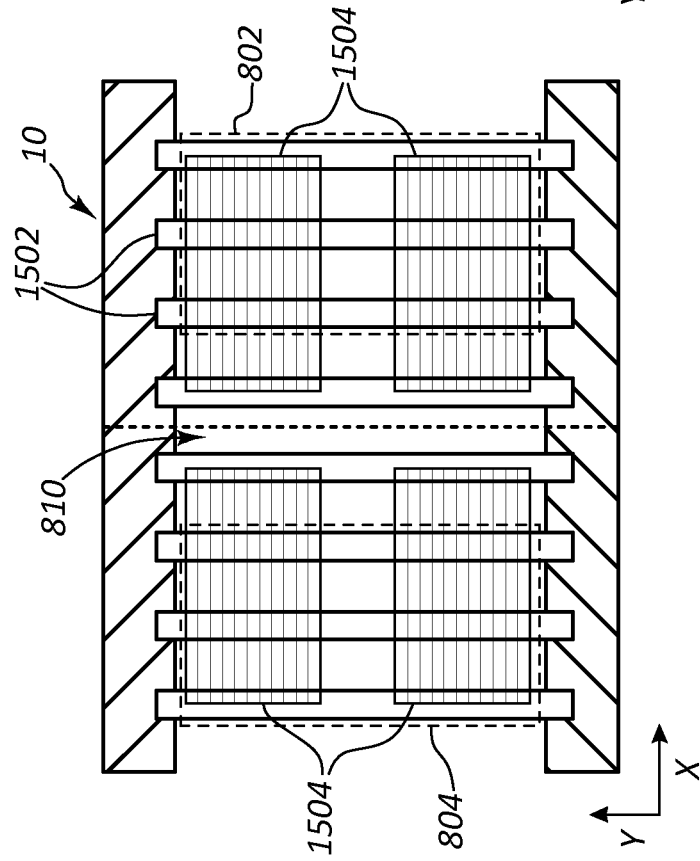
FIG. 8 is a top view of a semiconductor structure illustrating a diffusion area.

A gate tie down structure as shown in FIG. 7 (location A) can reduce semiconductor structure scaling and can reduce cost. A commercially available semiconductor structure 10 is shown in FIG. 8. Semiconductor structure 10 can include a first logic area 802 and a second logic area 804. Semiconductor structure 10 can include gate rows 1502 and fin rows 1506. In the commercially available semiconductor 10 as shown in FIG. 8, a diffusion break 810 can be provided between first logic area 802 and second logic area 804. Diffusion break 810 can be a double diffusion break and can include a width of more than two gate lengths (gate length is ordinarily measured adding the x-dimension as shown in FIG. 8). Diffusion break 810 can include a trench and a dielectric material formation can be included in the trench to provide electrical isolation between area 802 and area 804.

Figure 9:
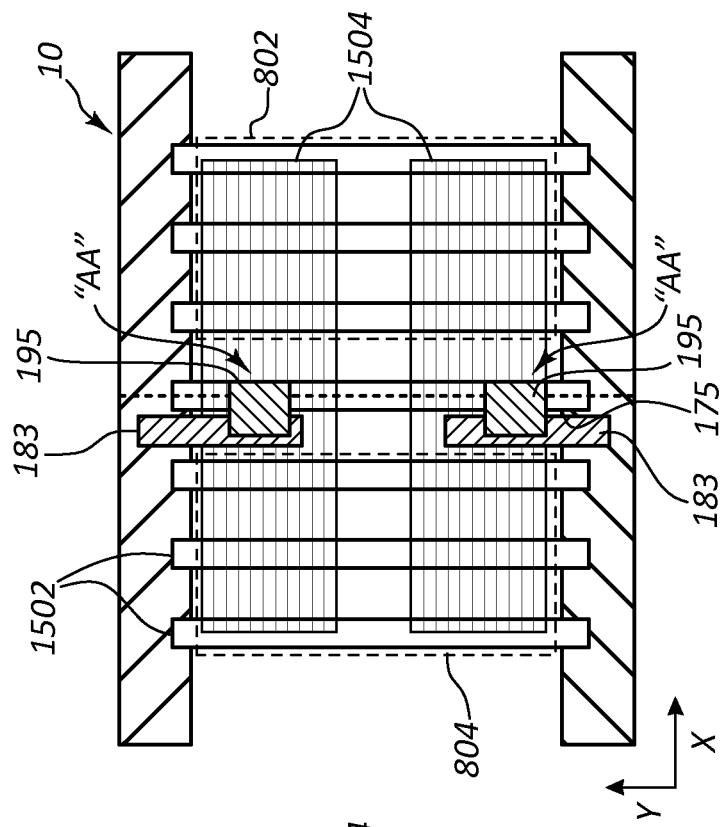
FIG. 9 is a top view of a semiconductor structure having a gate tie down for isolation between first and second logic areas.

In the embodiment of FIG. 9, semiconductor structure 10 includes at locations "AA" the gate tie down structure as shown in location "A" of FIG. 7. As shown in FIG. 9, gate layer 195 (in the form shown in FIG. 7) can provide an electrical connection between gate 150 and source-drain 120 to define a gate-tie down structure. As shown in FIG. 9, gate layer 195 (in the form shown in FIG. 7) can provide an electrical connection between gate 150 and source-drain 120 to define a gate-tie down structure by being in electrical contact with contact layer 183 that is in electrical contact with source-drain 120. In one embodiment, source-drain 120 (FIG. 7) can be tied to ground so that with the gate tie down structure formed, the gate 150 and the source-drain 120 (FIG. 7) are electrically grounded. The providing of an electrical connection between gate 150 and source-drain 120 with use of the gate tie down structure at locations "AA" (FIG. 9) can provide electrical isolation between first logic area 802 and second logic area 804 to avoid formation of a diffusion break 810 as shown in FIG. 8. The providing of the gate tie down structure at locations "AA" (FIG. 9) can reduce a spacing distance between first logic area 802 and second logic area 804 to decrease cost and increase a percentage area of semiconductor structure 10 having active devices.

Figure 10:
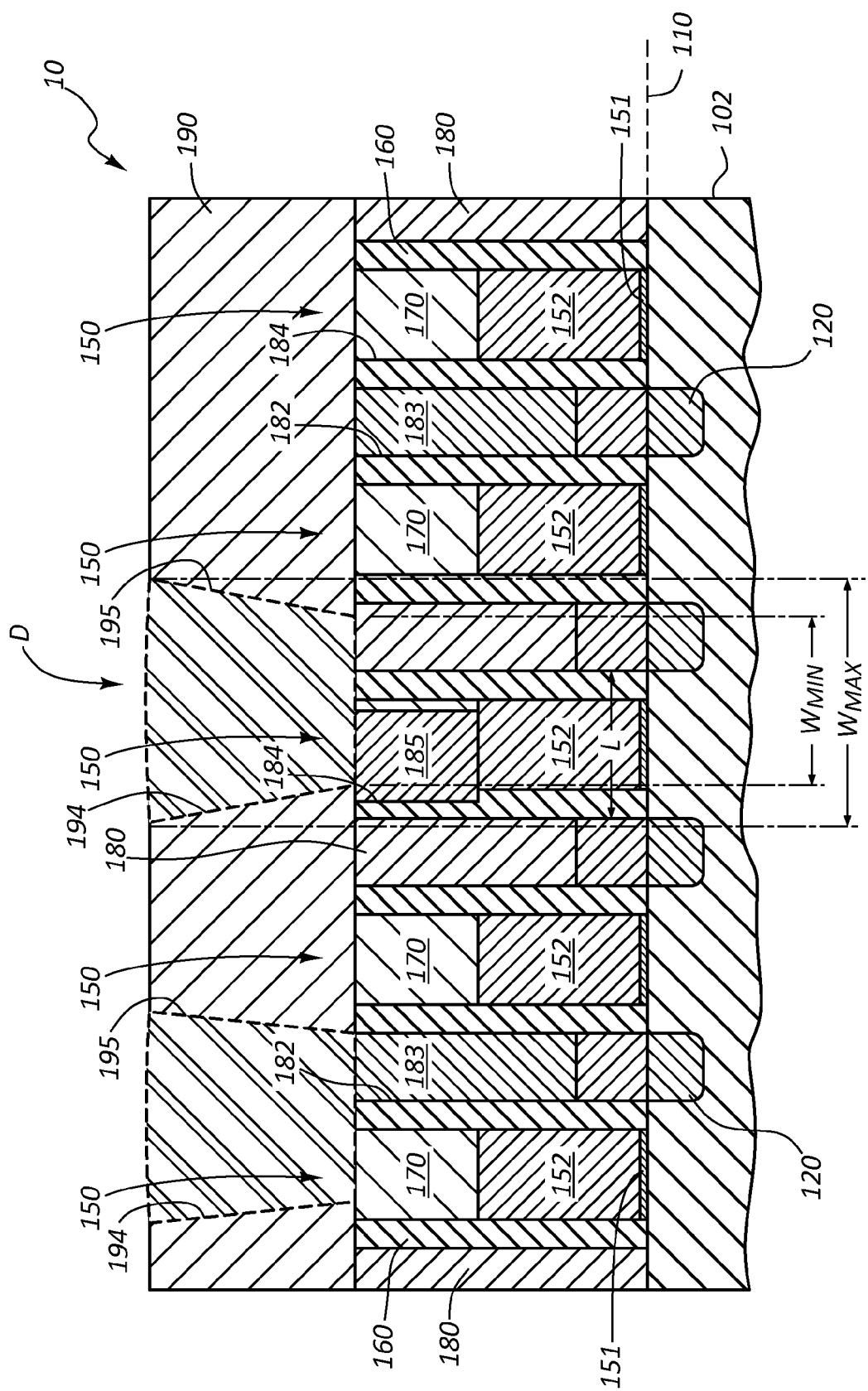
FIG. 10 is a side view of a semiconductor structure having a "fat" contact layer.

The providing of a gate contact structure having first and second layers can facilitate use of a "fat" gate contact layer. As shown in FIG. 10 gate layer 195 can have a minimum width, Wmin (in the horizontal direction shown in FIG. 10) greater than a gate length, L. That is Wmin≥L. An average and maximum width of gate contact layer 195 can also be greater than a gate length. That is, Wavg>L and Wmax>L. Providing a gate contact layer having a larger width than a gate length can be advantageous and can provide, e.g., increased current carrying capacity. It is seen that without use of a gate contact structure having first and second layers as set forth herein, the providing of an enlarged width gate contact layer can result in electrical shorting between adjacent gates. With the contact structure set forth herein, capping layer 170 of an adjacent gate formed of dielectric material can prevent electrical shortage.

Each of the formed layers as set forth herein, e.g., layer 151, 152, layer 160, layer 170, layer 180, layer 190, layer 185, layer 195, layer 102 can be formed by way of deposition using any of a variety of deposition processes, including, for example, physical vapor deposition (PVD), atomic layer deposition (ALD), chemical vapor deposition (CVD), sputtering, or other known processes, depending on the material composition of the layer.

In one example, a protective mask layer as set forth herein, e.g., a mask layers for patterning layer 151, layer 152, layer 160, layer 170, layer 180, layer 190, layer 185, layer 195, layer 102 as set forth herein may include a material such as, for example, silicon nitride, silicon oxide, or silicon oxynitride, and may be deposited using conventional deposition processes, such as, for example, CVD or plasma-enhanced CVD (PECVD). In other examples, other mask materials may be used depending upon the materials used in semiconductor structure. For instance, a protective mask layer may be or include an organic material. For instance, flowable oxide such as, for example, a hydrogen silsesquioxane polymer, or a carbon-free silsesquioxane polymer, may be deposited by flowable chemical vapor deposition (F-CVD). In another example, a protective mask layer may be or include an organic polymer, for example, polyacrylate resin, epoxy resin, phenol resin, polyamide resin, polyimide resin, unsaturated polyester resin, polyphenylene ether resin, polyphenylenesulfide resin or benzocyclobutene (BCB).

Removing material of a layer as set forth herein, e.g., layer 151, layer 152, layer 160, layer 170, layer 180, layer 190, layer 185, layer 195, layer 102 can be achieved by any suitable etching process, such as dry or wet etching processing. In one example, isotropic dry etching may be used by, for example, ion beam etching, plasma etching or isotropic RIE. In another example, isotropic wet etching may also be performed using etching solutions selective to the material subject to removal.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor structure comprising:
   a gate having gate spacers, a gate dielectric layer, and a conductive work function layer; and
   a contact structure having a first contact layer and a second contact layer, the second contact layer being formed on the first contact layer, wherein the second contact layer provides an electrical connection to a source-drain adjacent to the gate to define a gate tie down structure.

2. The semiconductor structure of claim 1, wherein the first contact layer has a top elevation in common with a top elevation of the gate spacers.

3. The semiconductor structure of claim 1, wherein the first contact layer is in contact with a conductive section of the gate.

4. The semiconductor structure of claim 1, wherein the first contact layer is in contact with a conductive work function layer.

5. The semiconductor structure of claim 1, wherein the second contact layer is in contact with a source-drain contact layer adjacent to the gate to define a gate tie down structure.

6. The semiconductor structure of claim 1, wherein the second contact layer has a minimum width larger than of gate length of the gate.

7. The semiconductor structure of claim 1, wherein the semiconductor structure includes a first logic area and a second logic area, and wherein the contact structure defines a gate tie down structure, the gate tie down structure providing electrical isolation between the first logic area and the second logic area.

8. A method for fabrication of a semiconductor structure comprising:
   providing a gate having gate spacers, a gate dielectric layer and one or more conductive work function layer; and
   forming a contact structure having a first contact layer and a second contact layer, the second contact layer being formed on the first contact layer, wherein the second contact layer defines a gate tie down electrically connected to a source-drain contact layer.

9. The method of claim 8, wherein the first contact layer has a top elevation in common with a top elevation of the gate spacers.

10. The method of claim 8, wherein the first contact layer is in contact with a conductive section of the gate.

11. The method of claim 8, wherein the first contact layer is in contact with a conductive work function layer.

12. The method of claim 8, wherein the second contact layer provides an electrical connection to a source-drain adjacent to the gate to define a gate tie down structure.

13. The method of claim 8, wherein the second contact layer is in contact with a source-drain contact layer adjacent to the gate to define a gate tie down structure.

14. The method of claim 8, wherein the second contact layer has a minimum width larger than a gate length of the gate.

15. A semiconductor structure comprising:
   a gate having gate spacers, a gate dielectric layer, and a conductive work function layer; and
   a contact structure having a first contact layer and a second contact layer, the second contact layer being formed on the first contact layer, wherein the second contact layer provides an electrical connection to a source-drain adjacent to the gate to define a gate tie down structure, wherein the semiconductor structure includes a first logic area and a second logic area, and wherein the contact structure defines the gate tie down structure, the gate tie down structure providing electrical isolation between the first logic area and the second logic area.

16. The semiconductor structure of claim 15, wherein the second contact layer is in contact with a source-drain contact layer adjacent to the gate to define a gate tie down structure.

* * * * *